(12) United States Patent
Sathe

(10) Patent No.: US 6,903,278 B2
(45) Date of Patent: Jun. 7, 2005

(54) ARRANGEMENTS TO PROVIDE MECHANICAL STIFFENING ELEMENTS TO A THIN-CORE OR CORELESS SUBSTRATE

(75) Inventor: Ajit V. Sathe, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 249 days.

(21) Appl. No.: 09/893,466

(22) Filed: Jun. 29, 2001

(65) Prior Publication Data

US 2003/0000736 A1 Jan. 2, 2003

(51) Int. Cl.$^7$ ................................................. H05K 1/16
(52) U.S. Cl. ..................... 174/255; 174/260; 361/760; 361/807
(58) Field of Search ................................ 174/255, 260, 174/250; 361/760, 764, 807, 809, 810, 783, 791; 257/778, 738, 707, 676, 697, 737

(56) References Cited

U.S. PATENT DOCUMENTS

| | | | | | |
|---|---|---|---|---|---|
| 4,912,401 | A | * | 3/1990 | Nady et al. | 324/755 |
| 4,997,377 | A | * | 3/1991 | Goto et al. | 439/68 |
| 5,391,924 | A | * | 2/1995 | Uchida et al. | 257/789 |
| 5,397,921 | A | * | 3/1995 | Karnezos | 257/779 |
| 5,515,241 | A | * | 5/1996 | Werther | 361/784 |
| 5,622,514 | A | * | 4/1997 | Crompton et al. | 439/342 |
| 5,694,297 | A | * | 12/1997 | Smith et al. | 361/785 |
| 5,724,232 | A | * | 3/1998 | Bhatt et al. | 361/762 |
| 5,777,387 | A | * | 7/1998 | Yamashita et al. | 257/737 |
| 5,841,188 | A | * | 11/1998 | Murasawa | 257/668 |
| 5,841,194 | A | * | 11/1998 | Tsukamoto | 257/729 |
| 5,864,470 | A | * | 1/1999 | Shim et al. | 174/254 |
| 5,895,967 | A | * | 4/1999 | Stearns et al. | 257/691 |
| 5,940,271 | A | * | 8/1999 | Mertol | 165/185 |
| 5,972,738 | A | * | 10/1999 | Vongfuangfoo et al. | 29/25.01 |
| 6,011,304 | A | * | 1/2000 | Mertol | 257/704 |
| 6,020,221 | A | * | 2/2000 | Lim et al. | 438/125 |
| 6,038,137 | A | * | 3/2000 | Bhatt et al. | 361/795 |
| 6,084,777 | A | * | 7/2000 | Kalidas et al. | 257/707 |
| 6,140,707 | A | * | 10/2000 | Plepys et al. | 257/778 |
| 6,150,193 | A | * | 11/2000 | Glenn | 438/113 |
| 6,201,301 | B1 | * | 3/2001 | Hoang | 257/712 |
| 6,221,693 | B1 | * | 4/2001 | Ho | 438/108 |
| 6,242,279 | B1 | * | 6/2001 | Ho et al. | 438/106 |
| 6,285,553 | B1 | * | 9/2001 | Suyama et al. | 165/185 |
| 6,287,890 | B1 | * | 9/2001 | Ho | 438/106 |
| 6,291,268 | B1 | * | 9/2001 | Ho | 438/108 |
| 6,313,521 | B1 | * | 11/2001 | Baba | 257/659 |
| 6,380,620 | B1 | * | 4/2002 | Suminoe et al. | 257/706 |
| 6,387,731 | B1 | * | 5/2002 | Wensel et al. | 257/737 |
| 6,406,942 | B2 | * | 6/2002 | Honda | 438/119 |

\* cited by examiner

*Primary Examiner*—Kamand Cuneo
*Assistant Examiner*—Ishwar Patel
(74) *Attorney, Agent, or Firm*—Michael D. Plimier

(57) ABSTRACT

In substrate packaging and mounting, such as for a flip chip mounted on a thin-core or coreless substrate, a high degree of rigidness and support is imparted to the substrate, to overcome bending/flexing/distortion during mounting/packaging of the chip and to prevent possible chip damage, by a stiffener. Such a stiffener may be of one or multiple pieces in any suitable shape/form to allow its non-interfering positioning on the substrate, and made by any suitable process of any suitable material, including conductive material and material capable of withstanding the temperatures of chip mounting/bonding operations. Such a stiffener prevents bending/flexing/distortion of thin-core and coreless substrate arrangements during mounting/interconnection processes to achieve thinner and more light-weight electronics specifically afforded by thin-core/coreless substrate arrangements while lowering manufacturing time/costs.

27 Claims, 4 Drawing Sheets

ARRANGEMENTS TO PROVIDE MECHANICAL STIFFENING ELEMENTS TO A THIN-CORE OR CORELESS SUBSTRATE

FIELD

The present invention relates to arrangements to provide mechanical stiffening elements to a thin-core or coreless substrate.

BACKGROUND

Mounting and packaging technologies of semiconductor circuits appear to be continuously in transition, with the continuing goals to achieve, for example, greater ease in mounting, lower manufacturing costs, more reliable mounting and packaging, and reduction in size and weight. Several mounting and packaging technologies which may emerge in the future are that of thin-core and coreless substrate packaging and mounting technologies. More specifically, there is significant drive from the mobile (e.g., notebooks, cellular phones and personal digital assistants (PDAs)) section of the electronics industry to achieve thinner and more lightweight electronics arrangements. Needed are mounting and packaging arrangements allowing thin-core and coreless substrate mounting and packaging technologies to be successfully implemented.

BRIEF DESCRIPTION OF THE DRAWING(S)

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represent brief descriptions of the drawings, wherein.

DETAILED DESCRIPTION

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Further, the drawings may not be to accurate dimensional scale. Well-known power/ground connections to substrates, ICs and other components may not be shown in great detail within the FIGS. for simplicity of illustration and discussion, and so as not to obscure the invention. Further, arrangements may be shown in simplistic diagram form in order to avoid obscuring the invention, and also in view of the fact that specifics with respect to implementation of such diagram arrangements are highly dependent upon the platform within which the present invention is to be implemented, i.e., such specifics should be well within purview of one skilled in the art. Where specific details are set forth in order to describe example embodiments of the invention, it should be apparent to one skilled in the art that the invention can be practiced without, or with variation of, these specific details.

While the following detailed description will describe example embodiments of the stiffener arrangements applied to thin-core substrates and coreless substrates in the context of an example flip chip (FC) pin grid array (PGA) arrangement (FC-PGA), practice of the present invention is not limited to such context, i.e., practice of the present invention may have uses with other types of chips and with other types of mounting and packaging technologies, e.g., flip chip ball grid array (FC-BGA).

Figure 1:
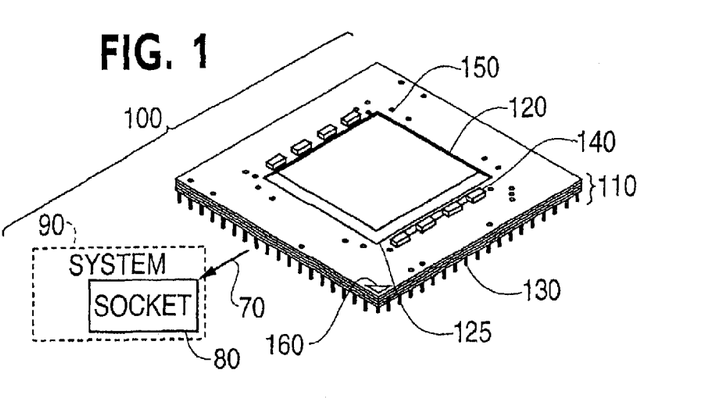
FIG. 1 relates to a perspective view of an example flip chip pin grid array (FC-PGA) system useful in explanation and understanding of background and example embodiments of the present invention.

Turning now to detailed description, FIG. 1 relates to a perspective view of an example FC-PGA system useful in explanation and understanding of background and example embodiments of the present invention. More particularly, FIG. 1 illustrates an integrated circuit (IC) printed circuit board (PCB) carrier package system, and more particularly, an example FC-PGA system 100 formed of a substrate 110 having a FC 120 mounted thereto, FC under-fill 125, pins 130, die side components (DSCs) 140, a plurality of exposed electrical interconnections 150, and an indexing mark 160. The substrate 110 may be, for example, a fiber-reinforced (FR) resin substrate, the FC 120 may be a solder-bumped FC die, and the under-fill 125 may be an epoxy under-fill. The pins 130 may be arranged in a PGA, and may be formed of copper alloy or Kovar material which is plated with nickel (Ni) and gold (Au). The die side components (DSCs) 140 are optional, and may be, for example, decoupling capacitors or resistors. In some industry embodiments, DSCs may be prohibited from a die side of the substrate. The exposed electrical interconnections 150 may be, for example, exposed laminate interconnections (described hereinafter). Finally, the indexing mark 160 may be a gold triangle, and serve as an index for, for example, a pin number 1.

The FC-PGA 100 may further include (not shown) an integrated heat spreader (IHS) mounted on top of FC die 120 through a thermal interface agent such as thermal grease or conductive epoxy. The IHS may be of any suitable size, and be made of any suitable material, for example, nickel-coated copper. A heat sink (not shown) may in turn be mounted on top of the IHS, or even directly on the FC die 120, again using a thermal agent. The FC-PGA arrangement is, in turn, insertable (indicated by arrow 70) into a socket 80 of an electronic system 90 (e.g., a notebook computer, cell phone, PDA, etc.).

Figure 2:
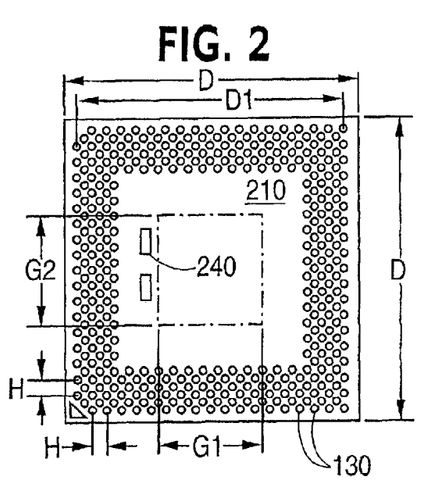
FIG. 2 is a bottom view of the example FIG. 1 FC-PGA substrate.

Turning next to FIG. 2, there is shown a bottom view of the example FIG. 1 FC-PGA substrate. More specifically, the bottom view 210 illustrates an example layout of a bottom (or pin) side PGA, pin side components (PSCs) 240 (e.g., decoupling capacitors and resistors), and also various industry dimensional notations (D, D1, G1, G2 and H) not important to discussion of the present invention.

Figure 3:
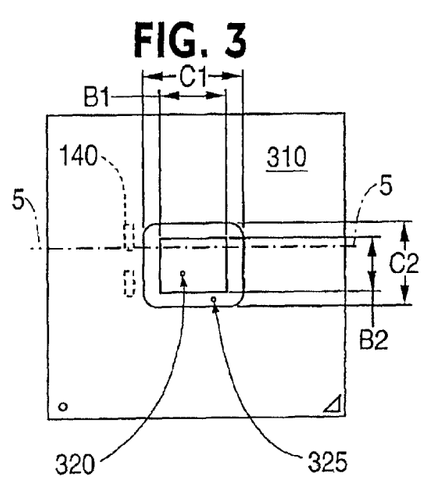
FIG. 3 is a top view of the example FIG. 1 FC-PGA substrate.

FIG. 3 is a top view of the example FIG. 1 FC-PGA substrate. More specifically, such top view 310 illustrates a die mounting area 320 as well as a FC under-fill area 325, and further shows various industry dimensional notations (B1, B2, C1 and C2) not important to discussion of the present invention, as well as DSC 140 (in dashed-line form).

Figure 4:
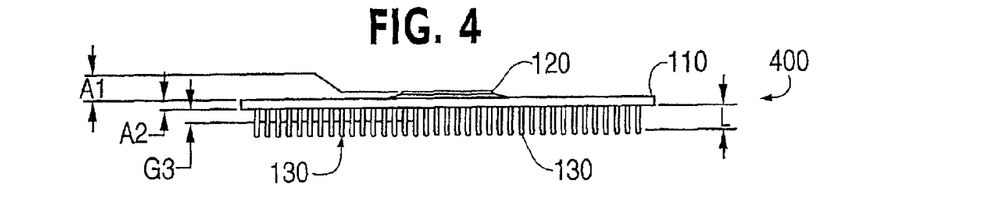
FIG. 4 is a simplistic side view of the example FIG. 1 FC-PGA substrate.

FIG. 4 is a simplistic side view of the example FIG. 1 FC-PGA substrate. More specifically, the simplistic side view 400 further includes various dimensional notations, with dimensional notations of interest including A1, which represents a die 120 (or die+IHS) height above substrate 110, and A2, which represents a substrate 110 thickness. Other dimensional notations (G3 and L) are not of interest to discussion of the present invention.

Figure 5:
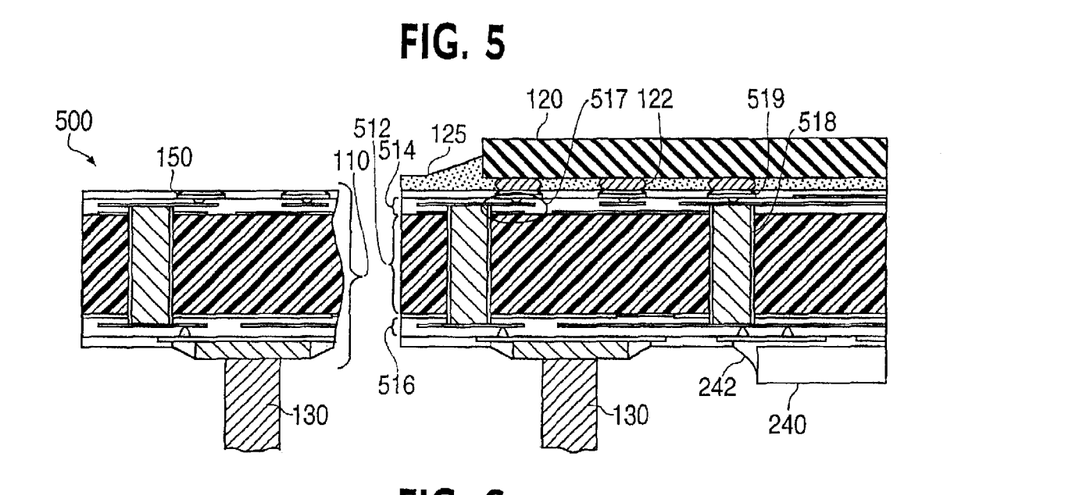
FIG. 5 is a magnified partial cross-sectional view of a part of the FIG. 1 FC-PGA system as taken along the FIG. 3 cross-sectional line 5—5, such view being useful in explanation and understanding of background and example embodiments of the present invention.

Turning now to more detailed illustration and discussion of relevant constructions of the FIG. 1 FC-PGA, FIG. 5 is a magnified partial cross-sectional view of a part of the FIG. 1 FC-PGA system as taken along the FIG. 3 cross-sectional line 5—5, such view being useful in explanation and understanding of background and example embodiments of the present invention. More particularly, the magnified partial cross-sectional view 500 more clearly illustrates that the FC-PGA substrate 110 is a pinned, laminated printed circuit board (PCB) structure in the form of an organic structure including an internal core 512 which may be, for example, a FR substrate formed of bismaleimide triazine (BT) resin reinforced with glass fiber, with a transition temperature (Tg) ranging from 165°–175° C. The core 512 may typically be 0.7–0.8 mm in thickness, and further, may be surrounded by multi-laminate layers on both sides of the core. More particularly, die side laminate layers 514 may be provided on a die side of the core 512, whereas pin side laminate layers 516 may be provided on a pin side of the core 512. The multi-laminate layers generally contain additional power, ground and signaling interconnects 517, for example, in the form of copper traces separated by dielectric layers, to provide electrical interconnections between the pins 130 and the substrate lands 519 (which, in turn, interface with and electrically interconnect to the FC bumps 122 of the FC 120).

Further included as substrate interconnection structures are via holes 518 drilled through the core 512 and/or the laminate layers 514, 516, and filled with electrically-conductive material to provide appropriate interlayer electric conduction paths. The FC 120 is more clearly shown as having a FC under-fill 125 associated therewith for bonding and hermetic sealing, while PSCs 240 are more clearly shown as having a PSC under-fill 242 associated therewith for bonding and hermetic sealing.

Whereas the internal core 512 typically may be, for example, 0.7–0.8 mm in thickness, the laminate layers 514, 516 may be, for example, constructed of a plurality of 15 μm copper interconnect laminate layers, and, for example, 30 μm dielectric laminate layers. Overall, a thickness dimension (A2; FIG. 4) of the substrate 110 may be, for example, in a thickness range of 1.0–1.2 mm. In contrast, the die 120 may be, for example, in a thickness range of 0.6–0.9 mm, and typically may be 0.8 mm.

The FIG. 5 example thick core substrate arrangement is advantageous in that the thick core 512 affords a high degree of rigidness or stiffness to the FC-PGA substrate 110 such that, when the FC 120 is mounted and interconnected to the substrate 110 via high pressure and heat (i.e., a high temperature thermo-bonding process), the FIG. 5 FC-PGA experiences no, or a negligible amount of, bending and flexing. Accordingly, the FC 120 can be securely and reliably mounted and interconnected to the substrate 110. In contrast, the FIG. 5 thick core substrate FC-PGA is disadvantageous in terms of thickness and weight. More specifically, as previously indicated, there is significant drive from the mobile (e.g., notebooks, cell phones and PDAs) section of the electronics industry to achieve thinner and more light-weight electronics arrangements, and accordingly, there is interest in developing thin-core and coreless substrate arrangements.

Figure 6:
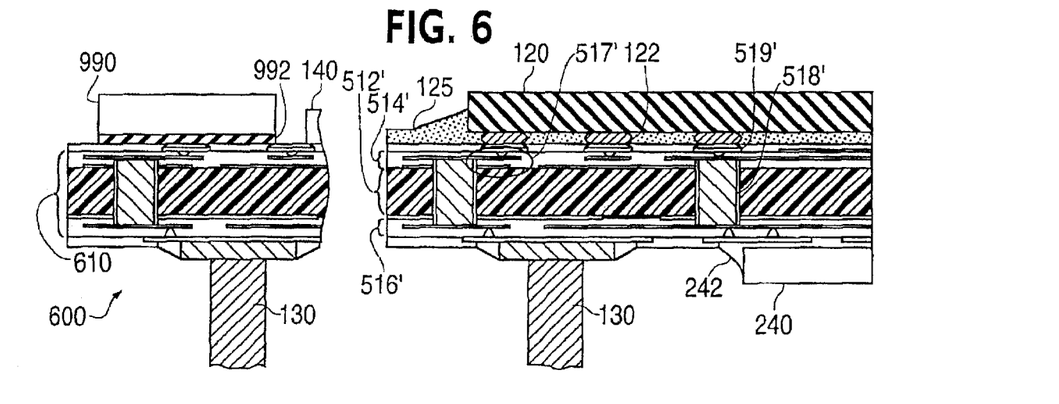
FIG. 6 is another magnified, partial cross-sectional view similar to FIG. 5, but which illustrates an alternative example of a FC-PGA arrangement which has a thin-core substrate, and which has an example stiffener arrangement as one example embodiment of the present invention.

More specifically, turning first to an illustration and discussion of a thin-core substrate arrangement, FIG. 6 is another magnified, partial cross-sectional view similar to FIG. 5, but which illustrates an alternative example of a FC-PGA arrangement which has a thin-core substrate, and which has an example stiffener arrangement as one example embodiment of the present invention. Only differences between FIGS. 5 and 6 will be discussed for the sake of brevity. That is, FIG. 6 illustrates an arrangement 600, including a substrate 610 composed of a thin-core 512' which may be in a thickness range of, for example, 0.1–0.5 mm, and more specifically, 0.4 mm, for example. The thin-core 512' may be constructed of FR substrate materials as previously discussed, or alternatively, may be of differing materials affording an even higher degree of rigidity. A remainder of the construction is substantially the same as FIG. 5, with FIG. 6 likewise including die side laminate layers 514', pin side laminate layers 516', laminate interconnections 517', vias 518', and substrate lands 519'. In comparing the background FIG. 5 arrangement having the thick core substrate of the example 0.8 mm core thickness, note that the FIG. 6 arrangement having the thin-core substrate of the example 0.4 mm core thickness results in a thickness savings of approximately 0.4 mm, as well as a corresponding weight savings.

Figure 7:
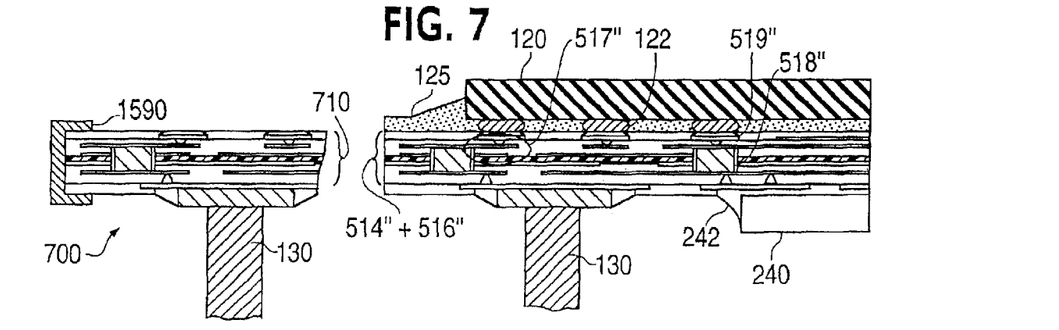
FIG. 7 is another magnified, partial cross-sectional view which shows another alternative example of a FC-PGA arrangement which has a coreless substrate, and which has an example edge stiffener arrangement as another example embodiment of the present invention.

Turning next to description of a coreless substrate arrangement, FIG. 7 is another magnified, partial cross-sectional view which shows another alternative example of a FC-PGA arrangement which has a coreless substrate, and which has an example edge stiffener arrangement as another example embodiment of the present invention. More specifically, the arrangement 700 includes a substrate 710 in which the core has been omitted, such that the substrate 710 corresponds only to a combination of the die side laminate layers 514" and pin side laminate layers 516". In comparing again with the FIG. 5 arrangement, note that the FIG. 7 coreless substrate arrangement results in an even greater thickness savings of approximately 0.8 mm, and again, substantial weight savings. Again, the various laminate copper interconnect layers and dielectric layers 514", 516", laminate interconnections 517", vias 518" and lands 519" may be as previously discussed, or alternatively, may be of differing materials affording an even higher degree of rigidity.

As thin-core/coreless substrate technologies are in their infancy or even just conceptual, the thin-core/coreless substrate arrangements pose significant technical challenges with respect to mechanical strength for pinning, assembly, handling during testing, socket engagement, etc. More particularly, discussion now turns to special considerations required with respect to the FIG. 6 thin-core substrate arrangement, and the FIG. 7 coreless substrate arrangement.

Figure 8:
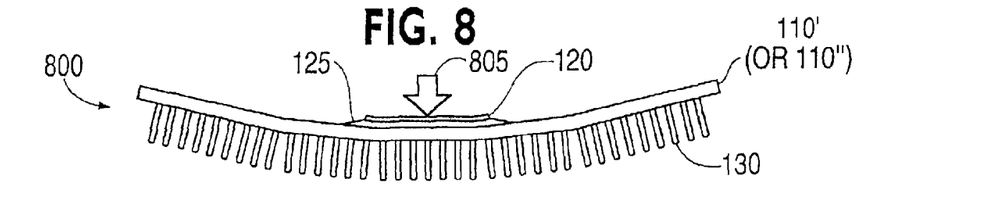
FIG. 8 is a simplified (without stiffener) cross-sectional view of the FIG. 6 example FC-PGA thin-core substrate arrangement, or the FIG. 7 example FC-PGA coreless substrate arrangement, with pressure applied thereto, resulting in disadvantageous bending/flexing distortion of the thin-core or coreless substrate.

More particularly, attention turns to FIG. 8, which is a simplified (without stiffener) cross-sectional view of the FIG. 6 example FC-PGA thin-core substrate arrangement, or the FIG. 7 example FC-PGA coreless substrate arrangement, with pressure applied thereto. More specifically, FIG. 8 illustrates a side view 800 of the FIG. 6 thin-core substrate 110' or FIG. 7 coreless substrate 110" having pressure 805 applied thereto, e.g., for the purpose of FC pressure/high temperature mounting and interconnecting. Due to the reduced rigidity or stiffness, the result is disadvantageous bending/flexing distortion of the thin-core or coreless substrate. That is, as shown in exaggerated form in FIG. 8, the thin-core/coreless substrate 110', 110" experiences substantial bending or flexing distortion upon pressure application. That is, the thin-core/coreless substrate 110', 110" does not have sufficient rigidity as does the FIG. 5 thick core substrate arrangement. The bending or flexing distortion is disadvantageous in a significant number of ways.

More particularly, first, the bending or flexing may result in unequal pressure distribution and stresses applied across the FC die 120, and thus a very distinct possibility is FC die cracking. Second, the excessive bending or flexing distortion may prevent or break critical electrical bonding and interconnection between various ones of the FC-bump-122/substrate-lands-519 pairs. Another distinct possibility is that excessive bending or flexing distortion may cause inter-laminations of the laminate layers 514', 516', 514", 516" to experience laminate separation, which may in turn result in critical electrical interconnect disruption within the laminate layers, and even total de-lamination. A further distinct possibility of excessive bending or flexing is that it may cause cracking or improper under-fill seating of either or both of the DSC under-fill 125 or PSC under-fill 242, leading to an imperfect bonding and/or hermetic seal (which may later cause problems due to moisture contamination). Still a further possibility is a major grid misalignment between respective pins within the PGA, such being shown in exaggerated form within FIG. 8. Any PGA pin misalignment would require an end user to do the difficult, if not impossible, task of realigning a multitude (e.g., many tens) of pins within the PGA so as to allow the FC-PGA arrangement to be mounted to another interfacing component (e.g., a zero insertion force (ZIF) socket 80 (FIGS. 1, 9)). Last but not least, excessive bending/flexing may result in partial or total DSC and/or PSC de-lamination, resulting in separation and detachment from the substrate 610, 710. Even after FC bonding, pressure exerted to the arrangement, e.g., during socket mounting or heat sink mounting, may likewise result in the excessive bending/flexing distortion, and accompanying problems, and may even result in further problems (e.g., metallic heat sink tilt/slippage resulting in contact and short-circuiting of the exposed electrical interconnections 150).

Figure 9:
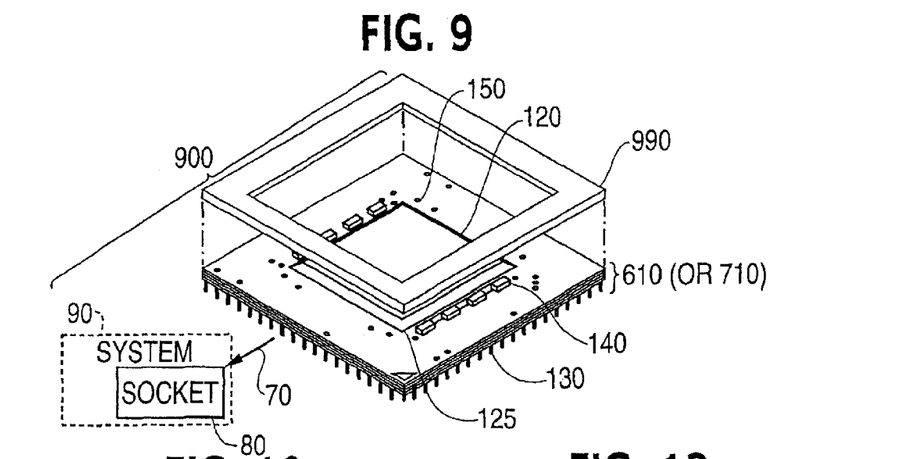
FIG. 9 is a perspective, partially-exploded view of an example FC-PGA system having an example stiffener arrangement according to one embodiment of the present invention.

Discussion turns now to example embodiments useful in overcoming any excessive bending or flexing distortion. More particularly, FIG. 9 is a perspective, partially-exploded view of an example FC-PGA system having an example stiffener arrangement according to one embodiment of the present invention. More specifically, FIG. 9 illustrates a stiffened arrangement 900 in partial exploded view, and including an example stiffener 990 located on a major die-side plane of the substrate. The stiffener 990 may be of a windowed, rectangular shape, and may be formed of any material providing a desired degree of stiffness or rigidity to the thin-core/coreless substrate 110, 110', a non-exhaustive listing of suitable materials includes metal, plastic, glass-like materials and ceramics.

As to formation, the stiffener 990 may be formed through any well-known process, for example, a non-exhaustive listing of suitable processes includes molding, stamping, etching, extruding and deposition. As a further advantageous arrangement, the stiffener 990 may be made of a suitable material capable of withstanding elevated temperatures, which may be experienced during a FC mounting/bonding operation, or during normal chip operating. As but one example of a suitable material, a thermoset plastic is advantageous as a stiffener in that elevated temperatures only serve to further set and strengthen such plastic.

As an additional advantageous arrangement, the stiffener 990 may have adequate clearance such that it does not interfere with other FC-PGA components, such as the die, under-fill, and DSCs. Still further, while the stiffener 990 may be made of a non-conductive or conductive material, if conductive, special precautions may be necessary. More particularly, an insulator material 992 (FIG. 6), such as an insulator gasket, may be inserted between the stiffener 990 and substrate 610, 710 whenever desired to prevent the conductive stiffener 990 from short-circuiting any exposed electrical interconnections 150 which may cause erroneous operation of, or damage to, the FC die 120. That is, for FC-PGA arrangements, electrically conductive surfaces such as any electrically conductive stiffener 990 or metal heat sink (not shown) should not touch any part of any exposed electrical interconnections, pins, DSCs, etc., on either the die or pin side of the FC-PGA.

Figure 10:
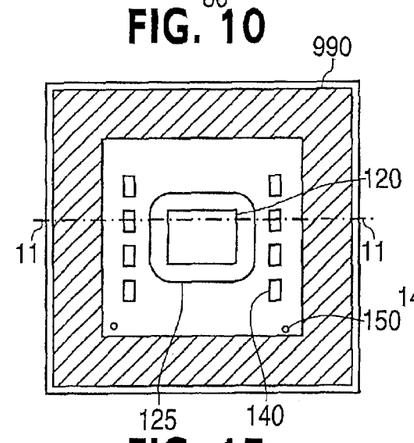
FIG. 10 is a top view of the example FIG. 9 FC-PGA system, and showing a top view of the FIG. 9 example stiffener.
Figure 11:
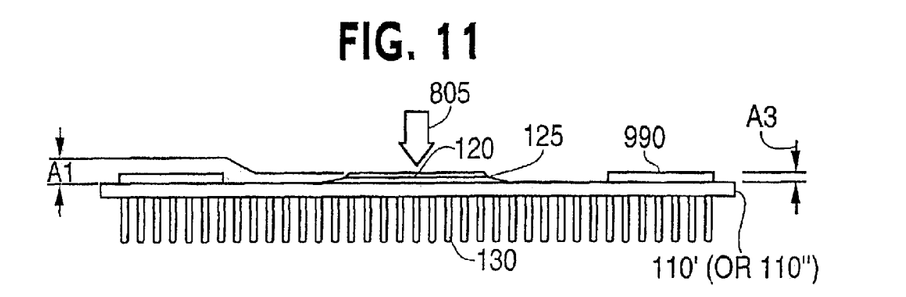
FIG. 11 is a simplified cross-sectional view as taken along cross-sectional lines 11—11 in FIG. 10, such view being useful in illustrating the FIG. 9 stiffener, and illustrating the improved rigidity or stiffening support of a thin-core or coreless substrate having the example stiffener of the present invention attached thereto.

Turning now to further relevant discussions, FIG. 10 is a top view of the example FIG. 9 FC-PGA system, and showing a top view of the FIG. 9 example stiffener. FIG. 11 is a simplified cross-sectional view as taken along cross-sectional lines 11—11 in FIG. 10, such view being useful in illustrating the FIG. 9 stiffener, and illustrating the improved rigidity of a thin-core or coreless substrate having the example stiffener of the present invention attached thereto. With regard to further detail, FIG. 11 illustrates a pressure 805 (such as a FC mounting/connecting pressure) being applied to a thin-core substrate 110' arrangement or a coreless substrate 110" arrangement having the stiffener 990 thereon. As shown within FIG. 11, the stiffener 990 provides enhanced rigidity such that the substrate 110', 110" does not experience substantial bending or flexing distortion. Thus, the luxury of a thinner, lighter-weight device is achieved through use of the addition of a stiffener 990.

Further relevant FIG. 11 discussions should be noted. More particularly, dimensional notations illustrate A1, which is an effective die arrangement height above the substrate, and A3 represents a stiffener height above the substrate. With regard to the die arrangement height A1, if an IHS is not to be included within the arrangement, then the dimension A1 simply represents a die height above the substrate. In contrast, if an IHS is to be included within the arrangement, then Al may represent a combined height of the die and the IHS above the substrate. As one example advantageous embodiment, the stiffener height A3 may be equal or less than in height than A1. More particularly, as mentioned previously, an important goal of the thin-core or coreless substrate arrangements is a reduction in the overall thickness of the FC-PGA arrangement. Any height of A3 which extends above A1 disadvantageously adds to an overall thickness of the FC-PGA arrangement.

A situation where A3 is substantially equal to A1 also may provide additional advantages. More particularly, with equal height, any heat sink arrangement (not shown) which is placed on top of the FC-PGA arrangement will contact both the FC die 120 and the stiffener 990, such that a load of the heat sink is more equally distributed across a broader and more dispersed area, thus reducing the potential for heat-sink-induced damage to the FC die 120. As a further advantage, contacting of the heat sink with all of the FC die 120 and stiffener 990 results in a situation where the heat sink is prevented from tilting/shifting such that excessive edge pressure to an edge of the FC die 120 is avoided, thereby again reducing the potential for damage to the FC die 120. Still further, by the heat sink contacting all of the FC die 120 and stiffener 990, a rigidity of the heat sink may be transferred to the thin-core or coreless substrate 110', 110" so as to further enhance a rigidity thereof.

Figure 12:
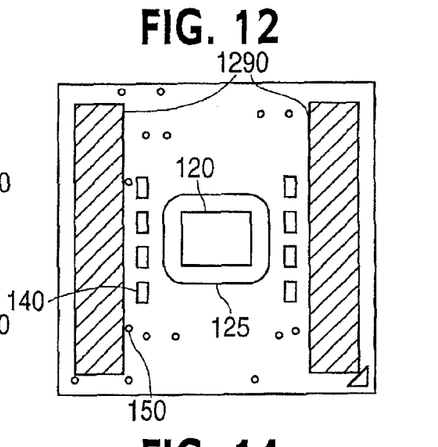
FIG. 12 is a top view similar to that of FIG. 10, but having an example multi-piece stiffener arrangement according to another example embodiment of the present invention.

Discussion turns next to FIG. 12, which is a top view similar to that of FIG. 10, but having an example multi-piece stiffener arrangement according to another example embodiment of the present invention. More particularly, FIG. 12 illustrates a stiffener provided via a plurality of stiffener parts 1290 which may, for example, be in the form of simple rectangles. One aspect to note with respect to comparison of FIG. 10 and FIG. 12 is that, whereas the stiffener 990 of FIG. 10 provides enhanced stiffness in a plurality of directions (e.g., bi-directionally), the stiffeners 1290 of FIG. 12 provide enhanced stiffness in substantially a single direction (e.g., uni-directionally). Such example embodiment may be advantageous to use (for weight and material savings) in situations where FC-PGA arrangements only need uni-directional stiffening.

Figure 13:
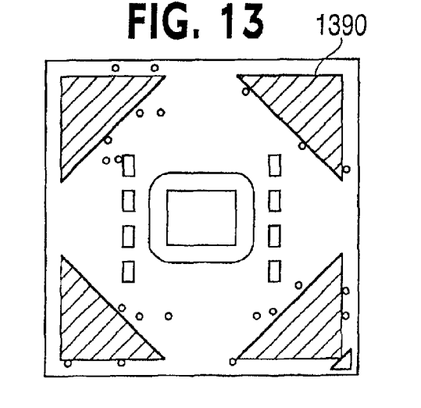
FIG. 13 likewise illustrates a top view having an example multi-piece stiffener arrangement according to another example embodiment of the present invention.
Figure 14:
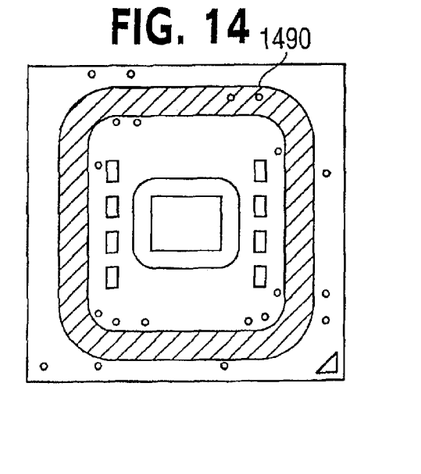
FIG. 14 also likewise illustrates a top view having an example alternatively-shaped stiffener according to another example embodiment of the present invention.

Continuing, FIG. 13 likewise illustrates a top view having an example multi-piece stiffener arrangement according to another example embodiment of the present invention, while FIG. 14 also likewise illustrates a top view having an example alternatively-shaped stiffener according to another example embodiment of the present invention. That is, FIG. 13 shows an example arrangement having example corner stiffeners 1390 providing selective stiffening, whereas FIG. 14 is illustrative of the fact that any regular or non-regular geometric shape 1490 is suitable for the stiffener embodiments of the present invention. More specifically, practice of the stiffeners of the present invention may require only the minimum of the stiffener providing a sufficient level of stiffness to avoid excessive FC-PGA bending or flexing distortions, and that the stiffener not interfere with any other FC-PGA components. At this point in time, it should be mentioned that some predetermined degree of flexing/bending distortion may be acceptable with respect to any given FC-PGA arrangement.

Figure 15:
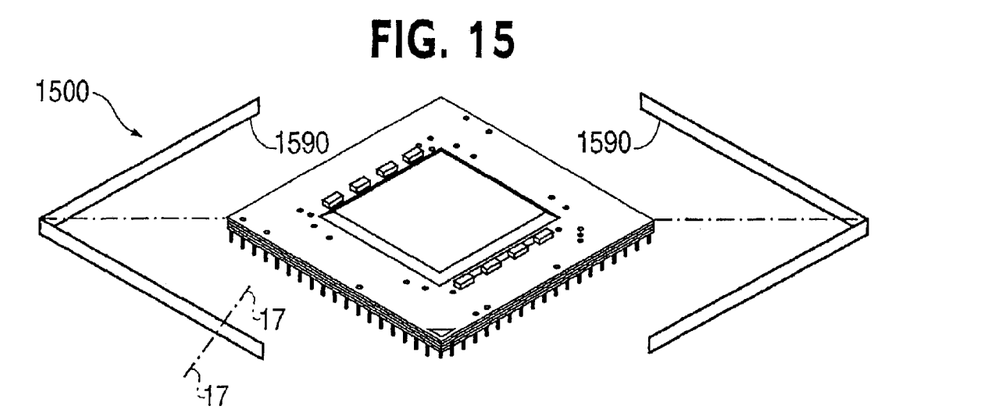
FIG. 15 is a perspective, partially-exploded view of another example FC-PGA system having an example edge stiffener arrangement of another example embodiment of the present invention being applied thereto.
Figure 16:
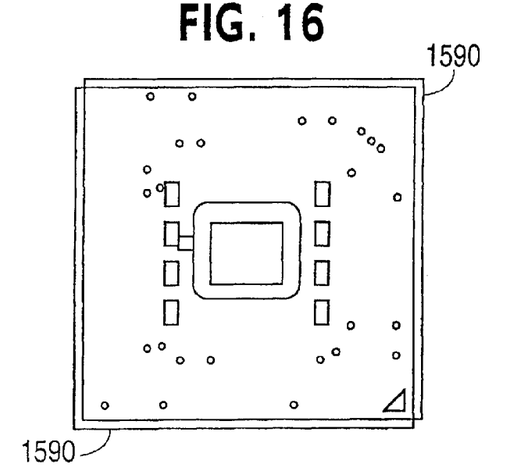
FIG. 16 is a top view of the FIG. 15 FC-PGA system after the example edge stiffener has been applied thereto.
Figure 17:
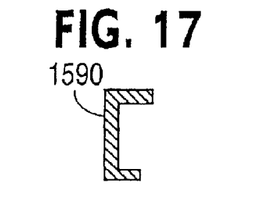
FIG. 17 is a cross-sectional view taken along lines 17—17 in FIG. 15, such view being useful in illustrating an example shape of the FIGS. 15 and 16 example edge stiffener.

FIG. 15 illustrates a perspective, partially-exploded view of another example FC-PGA system having an example edge stiffener arrangement of another example embodiment of the present invention being applied thereto another alternative embodiment of the present invention. More specifically, illustrated as arrangement 1500 are edge stiffener components 1590 aligned for application to the FC-PGA, with FIG. 16 illustrating such edge stiffener components already applied to the FC-PGA. With regard to construction, the edge stiffener components may simply be flat, or more advantageously, may be of a generally C-shaped cross-section 1590 (FIG. 17), which is adapted to mate with the edge of the substrate 110', 110", as is illustrated on a left-hand side of FIG. 7. The FIGS. 15–17 edge stiffener component arrangements are advantageous in that a high level of stiffening may be provided owing to the vertical sides and C-shaped cross-section. Accordingly, such edge stiffener components may be made of a thinner material. Such FIGS. 15–17 stiffener arrangements are, however, disadvantageous in that the edge stiffener components are more difficult to manufacture, much harder to mount to a FC-PGA, and the substrate 110', 110" thickness must be more tightly controlled so as to fit properly within the internal channel of the edge stiffening component 1590. In closing, all prior discussions are equally applicable to the example edge stiffener embodiment.

While it is envisioned that the stiffeners of the present invention may be added to thin-core or coreless substrates after the substrates are received from manufacturers, it is envisioned that it may be more advantageous to receive thin-core or coreless substrates from manufactures having the stiffeners pre-attached thereto.

In addition to all of the above advantages, the stiffened thin-core/coreless substrate FC-PGA arrangements of the present invention may have the further advantage of reducing packaging parameters (e.g., inductance, resistance, etc.) owing to the thinner size and reduced electrical interconnection lengths.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An integrated circuit printed circuit board (IC-PCB) carrier package having a substrate, and a stiffener to provide stiffening support to the substrate, and wherein the substrate includes at least five layers, wherein the at least five layers include a first layer with a thickness between about 0.1 mm and 0.5 mm and at least four laminate layers, at least two of the laminate layers on a first side of the first layer and at least two of the laminate layers on a second side of the first layer, none of the laminate layers having a thickness greater than about 30 microns.

2. An IC-PCB carrier package as claimed in claim 1, the IC-PCB carrier package being one of a flip chip pin grid array (FC-BGA) or a flip chip ball grid array (FC-BGA).

3. An IC-PCT carrier package as claimed in claim 1, where the stiffener is substantially made of a ceramic material, is one of a molded, stamped, etched, extruded or deposited stiffener, and is capable of withstanding high temperatures of at least one of an IC die bonding operation and normal IC operation.

4. An IC-PCT carrier package as claimed in claim 1, the stiffener being planar and mounted to a die-side major planar surface of the substrate.

5. An IC-PCT carrier package as claimed in claim 1, the stiffener having an internal window therein to provide clearance for at least one of a die, under-fill, die side components (DSC), or integrated heat spreader (IHS).

6. An IC-PCT carrier package as claimed in claim 1, the stiffener having an above-substrate-plane height, which is less-than or equal to an above-substrate-plane height, when mounted, of one of: an IC-die, or a combination of an IC-die with an integrated heat spreader (IHS).

7. An IC-PCT carrier package as claimed in claim 1, the stiffener having a top surface above a substrate-plane, which is substantially co-planar with, when mounted, a top surface of a combination of an IC-die with an integrated heat spreader.

8. An IC-PCT carrier package as claimed in claim 7, the stiffener being disposable to co-support a heat sink, with a combination of an IC-die with an integrated heat spreader (IHS).

9. An IC-PCT carrier package as claimed in claim 1, where a main body of the stiffener is electrically conductive, the stiffener further includes an insulator to electrically insulate electrical members on stiffener-opposing areas of the substrate.

10. A packaged integrated circuit (IC) comprising:

an IC, and an integrated circuit printed circuit board (IC-PCB) carrier package having a substrate, and a stiffener to provide stiffening support to the substrate, and wherein the substrate includes at least five layers, wherein the at least five layers include a first layer with a thickness between about 0.1 mm and 0.5 mm and at least four laminate layers, at least two of the laminate layers on a first side of the first layer and at least two of the laminate layers on a second side of the first layer, none of the laminate layers having a thickness greater than about 30 microns.

11. A packaged IC as claimed in claim 10, the IC-PCB carrier package being one of a flip chip pin grid array (FC-PGA) or a flip chip ball grid array (FC-BGA) carrier package.

12. A packaged IC as claimed in claim 10, where the stiffener is substantially made of a thermosetting plastic material.

13. A packaged IC as claimed in claim 10, the stiffener being planar and mounted to a die-side major planar surface of the substrate.

14. A packaged IC as claimed in claim 10, the stiffener having an internal window therein to provide clearance for at least one of a die, under-fill, die side components (DSC), or integrated heat spreader (IHS).

15. A packaged IC as claimed in claim 10, the stiffener having an above-substrate-plane height, which is less-than or equal to an above-substrate-plane height, when mounted, of one of: an IC-die, or a combination of an IC-die with an integrated heat spreader (IHS).

16. A packaged IC as claimed in claim 10, the stiffener having a top surface above a substrate-plane, which is substantially co-planar with, when mounted, a top surface of a combination of an IC-die with an integrated heat spreader.

17. A packaged IC as claimed in claim 16, the stiffener being disposable to co-support a heat sink, with a combination of an IC-die with an integrated heat spreader (IHS).

18. A packaged IC as claimed in claim 10, where a main body of the stiffener is electrically conductive, the stiffener further includes an insulator to electrically insulate electrical members on stiffener-opposing areas of the substrate.

19. An electronic system comprising:

a packaged integrated circuit (IC) having an IC, and an integrated circuit printed circuit board (IC-PCB) carrier package having a substrate, wherein the substrate includes at least five layers, wherein the at least five layers include a first layer with a thickness between about 0.1 mm and 0.5 mm and at least four laminate layers, at least two of the laminate layers on a first side of the first layer and at least two of the laminate layers on a second side of the first layer, none of the laminate layers having a thickness greater than about 30 microns, and a stiffener to provide stiffening support to the substrate;

a receiving socket to receive the packaged IC; and at least one input/output device.

20. An electronic system as claimed in claim 19, IC-PCB carrier package being one of a flip chip pin grid array (FC-PGA) and a flip chip ball grid (FC-BGA) carrier package.

21. An electronic system as claimed in claim 19, where the stiffener is substantially made of at least one of a metal, plastic, glass or ceramic material, is an extruded stiffener, and is capable of withstanding high temperatures of at least one of an IC die bonding operation and normal IC operation.

22. An electronic system as claimed in claim 19, the stiffener being planar and mounted to a die-side major planar surface of the substrate.

23. An electronic system as claimed in claim 19, the stiffener having an internal window therein to provide clearance for at least one of a die, under-fill, die side components (DSC), or integrated heat spreader (IHS).

24. An electronic system as claimed in claim 19, the stiffener having an above-substrate-plane height, which is less-than or equal to an above-substrate-plane height, when mounted, of one of: an IC-die, or a combination of an IC-die with an integrated heat spreader (IHS).

25. An electronic system as claimed in claim 19, the stiffener having a top surface above a substrate-plane, which is substantially co-planar with, when mounted, a top surface of a combination of an IC-die with an integrated heat spreader.

26. An electronic system as claimed in claim 25, the stiffener being disposable to co-support a heat sink, with a combination of an IC-die with an integrated heat spreader (IHS).

27. An electronic system as claimed in claim 19, where a main body of the stiffener is electrically conductive, the stiffener further includes an insulator to electrically insulate electrical members on stiffener-opposing areas of the substrate.

\* \* \* \* \*